United States Patent
Kulik et al.

(10) Patent No.: US 8,937,275 B2
(45) Date of Patent: Jan. 20, 2015

(54) METHOD AND APPARATUS TO MONITOR GAIN OF A PROPORTIONAL COUNTER INCLUDING CORRECTING THE COUNTING THRESHOLD OF A PULSE HEIGHT SPECTRUM

(71) Applicants: Alex Kulik, Sugar Land, TX (US); Alexander Joseph Esin, Sugar Land, TX (US)

(72) Inventors: Alex Kulik, Sugar Land, TX (US); Alexander Joseph Esin, Sugar Land, TX (US)

(73) Assignee: Thermo Fisher Scientific Inc., Sugar Land, TX (US)

( * ) Notice: Subject to any disclaimer, the term of this patent is extended or adjusted under 35 U.S.C. 154(b) by 209 days.

(21) Appl. No.: 13/650,771

(22) Filed: Oct. 12, 2012

(65) Prior Publication Data
US 2014/0105350 A1 Apr. 17, 2014

(51) Int. Cl.
*H01J 40/14* (2006.01)
*H03K 21/02* (2006.01)

(52) U.S. Cl.
CPC ..................................... *H03K 21/02* (2013.01)
USPC .................................. 250/214 R; 250/214.1

(58) Field of Classification Search
USPC ................ 250/214.1, 214 R, 390.01, 390.07; 356/303; 327/514
See application file for complete search history.

(56) References Cited

U.S. PATENT DOCUMENTS

| | | | |
|---|---|---|---|
| 4,296,320 A | 10/1981 | Miller | |
| 4,433,240 A | 2/1984 | Seeman | |
| 5,160,844 A * | 11/1992 | Albats | ...................... 250/390.07 |
| 5,410,428 A | 4/1995 | Yamagata et al. | |
| 5,422,480 A | 6/1995 | Schultz | |
| 5,475,727 A | 12/1995 | Buchanan et al. | |
| 8,022,355 B2 | 9/2011 | Kulik et al. | |
| 2008/0265151 A1 | 10/2008 | Gadot | |

FOREIGN PATENT DOCUMENTS

| | | |
|---|---|---|
| EP | 0483752 A2 | 5/1992 |
| FR | 2626121 A1 | 7/1989 |
| JP | S58200186 A | 11/1983 |
| SU | 779960 A1 | 11/1980 |

OTHER PUBLICATIONS

Combined Search and Examination Report issued Jan. 14, 2014 in corresponding GB application No. GB1313190.9 (6 pages).

* cited by examiner

*Primary Examiner* — Que T Le
(74) *Attorney, Agent, or Firm* — Osha · Liang LLP (57) ABSTRACT

A method and apparatus in accordance with the present disclosure relate to monitoring gain of a proportional counter. The method includes generating a pulse height spectrum of the proportional counter, defining a first window and a second window within the pulse height spectrum, counting electrical pulses outputted by the proportional counter within the first window of the pulse height spectrum, thereby defining a first window count, counting electrical pulses outputted by the proportional counter within the second window of the pulse height spectrum, thereby defining a second window count, and determining a difference between the first window count and the second window count.

18 Claims, 6 Drawing Sheets

METHOD AND APPARATUS TO MONITOR GAIN OF A PROPORTIONAL COUNTER INCLUDING CORRECTING THE COUNTING THRESHOLD OF A PULSE HEIGHT SPECTRUM

FIELD OF THE DISCLOSURE

The present disclosure relates generally to a proportional counter, and more specifically to a process for monitoring gain of a proportional counter.

BACKGROUND

Detectors of high-energy and ionizing radiations are used in various applications. Such detectors, for example, include ion chambers, proportional counters, Geiger-Mueller counters, and scintillation counters, and may be used to detect high energy photons, such as X-rays or gamma-rays. As such, gamma-rays have been used to measure the density and level of fluids in a vessel by using a gamma-ray source positioned opposite or near a gamma-ray detector. Gamma-ray density and level measurements are useful where the materials measured are hazardous, extremely hot, or where direct contact measurements are otherwise not possible. Additionally, the source and detector are mounted outside the vessel, and no modification to the vessel is required. Gamma-rays emitted by a source may be absorbed or attenuated by the vessel and the material in the vessel. The strength of the gamma radiation reaching a detector may be used to indicate the density or level of a fluid in a vessel based upon the intensity of the source.

When measuring fluid level, for example, gamma-ray emitters and/or detectors may be positioned on or near a vessel, where the presence or absence of a signal (or a nominal low signal) may indicate the presence or absence of a fluid near the source and detector. With respect to fluid density, fluid near the gamma-ray source and detector may absorb or attenuate gamma-rays emitted by the source. For example, a high radiation count may indicate a low fluid density, while a low count may indicate a high fluid density.

A primary variable with respect to the amount of gamma-rays emitted from the source that reach the detector is the fluid contained within the vessel. A percentage of the gamma-rays emitted by the source are absorbed or attenuated by fluid and, therefore, do not reach the detector. Thus, the counting rate of the output signal from a photo multiplier tube of a detector may be related to the density of fluid through which the rays must pass to reach the detector and the intensity of the gamma radiation source.

Various factors, however, have been known to affect the reliability of the high-energy and ionizing radiation detectors. For example, a detector working within the industrial environment, as described above, may be expected to operate for a long duration of time, such as a matter of years, at temperatures within a broad spectrum. Accordingly, there exists a need for optimizing the use of a detector, particularly as the conditions only become more extreme in various applications for these detectors.

SUMMARY OF INVENTION

In general, in one aspect, the present disclosure relates to a method for monitoring gain of a proportional counter. The method includes generating a pulse height spectrum of the proportional counter, defining a first window and a second window within the pulse height spectrum, counting electrical pulses outputted by the proportional counter within the first window of the pulse height spectrum, thereby defining a first window count, counting electrical pulses outputted by the proportional counter within the second window of the pulse height spectrum, thereby defining a second window count, and determining a difference between the first window count and the second window count.

In general, in another aspect, the present disclosure relates to a gain monitoring system for monitoring gain of a proportional counter. The system includes a memory, a processor operatively connected to the memory, computer-readable instructions stored in the memory for causing the processor to monitor the gain of the proportional counter. The instructions include generating a pulse height spectrum of the proportional counter, defining a first window and a second window within the pulse height spectrum, counting electrical pulses outputted by the proportional counter within the first window of the pulse height spectrum, thereby defining a first window count, counting electrical pulses outputted by the proportional counter within the second window of the pulse height spectrum, thereby defining a second window count, and determining a difference between the first window count and the second window count.

In general, in yet another aspect, the present disclosure relates to a method for monitoring gain of a proportional counter. The method includes generating a pulse height spectrum of the proportional counter, defining a first window and a second window within the pulse height spectrum, counting electrical pulses outputted by the proportional counter within the first window of the pulse height spectrum, thereby defining a first window count, counting electrical pulses outputted by the proportional counter within the second window of the pulse height spectrum, thereby defining a second window count, counting electrical pulses outputted by the proportional counter above a predetermined counting threshold of the pulse height spectrum, determining a difference between the first window count and the second window count, correcting thresholds defining the first window and the second window of the pulse height spectrum based upon the determined difference, and correcting the counting threshold of the pulse height spectrum based upon the determined difference, in which the correction of the counting threshold of the pulse height spectrum is a fraction of the correction of the thresholds defining the first window and the second window of the pulse height spectrum.

Other aspects and advantages of the disclosure will be apparent from the following description and the appended claims.

DETAILED DESCRIPTION

Specific embodiments of the present disclosure will be described with reference to the accompanying figures. In the following detailed description of embodiments, numerous specific details are set forth in order to provide a more thorough understanding of the disclosure. However, it will be apparent to one of ordinary skill in the art that the present disclosure may be practiced without these specific details. In other instances, well-known features have not been described in detail to avoid obscuring the disclosure.

In general, whenever a certain amount of energy is deposited in a high-energy and ionizing radiation detector, such as a proportional counter, the detector outputs an electrical signal as a pulse having a certain height (or amplitude). The conversion factor between the input energy and the output pulse height may be defined as the gain. One or more embodiments of the present disclosure controls, stabilizes, and otherwise monitors this gain, which may fluctuate due to factors, such as temperature, aging rate of the detector, and other various factors.

Figure 1:
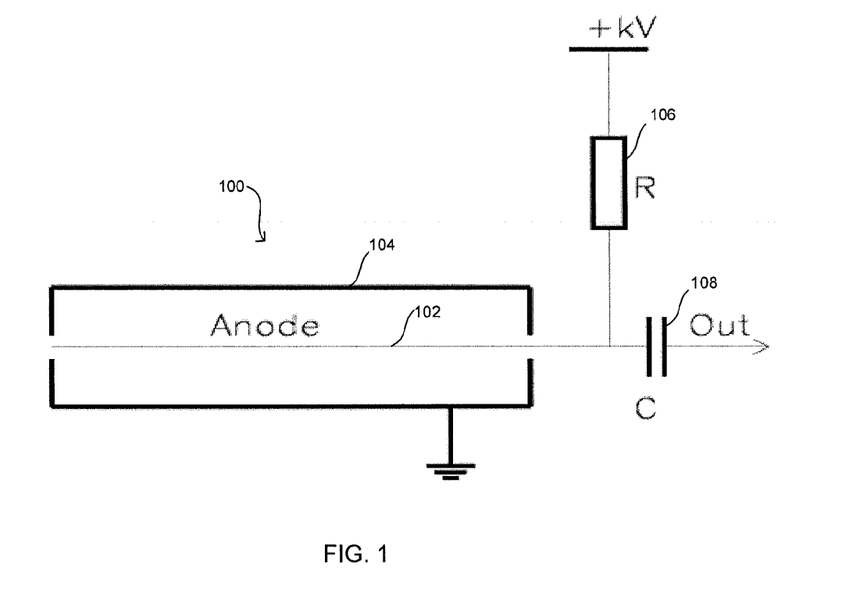
FIG. 1 shows a schematic view of a proportional counter in accordance with one or more embodiments of the present disclosure.

A proportional counter in accordance with the present disclosure may have a variety of configurations and arrangements. As such, referring now to FIGS. 1 and 2, schematic views of a proportional counter 100 in accordance with one or more embodiments of the present disclosure is shown. The proportional counter 100 may include an anode 102 and a cathode 104 with a gas being contained within the proportional counter 100 between the anode 102 and the cathode 104. In one or more embodiments, the cathode 104 may be a cylindrical housing, as shown, in which the anode 102 may be a thin wire that is centrally located within the cathode 104. The anode 102 may have a positive potential applied thereto, thereby creating a non-uniform electrostatic field within the proportional counter 100. A resistor 106 and a capacitor 108 may then be connected to the anode 102 of the proportional counter 100 to measure an electrical signal produced by the anode 102 of the proportional counter 100. As shown in FIG. 1, a capacitive coupling is shown in use with the proportional counter 100. However, those having ordinary skill in the art will appreciate that the present disclosure is not so limited, as other couplings may be used within a proportional counter without departing from the present disclosure. For example, a capacitive coupling, an inductive coupling, a DC coupling, and/or any other coupling known in the art may be used within a proportional counter without departing from the scope of the present disclosure.

Figure 2:
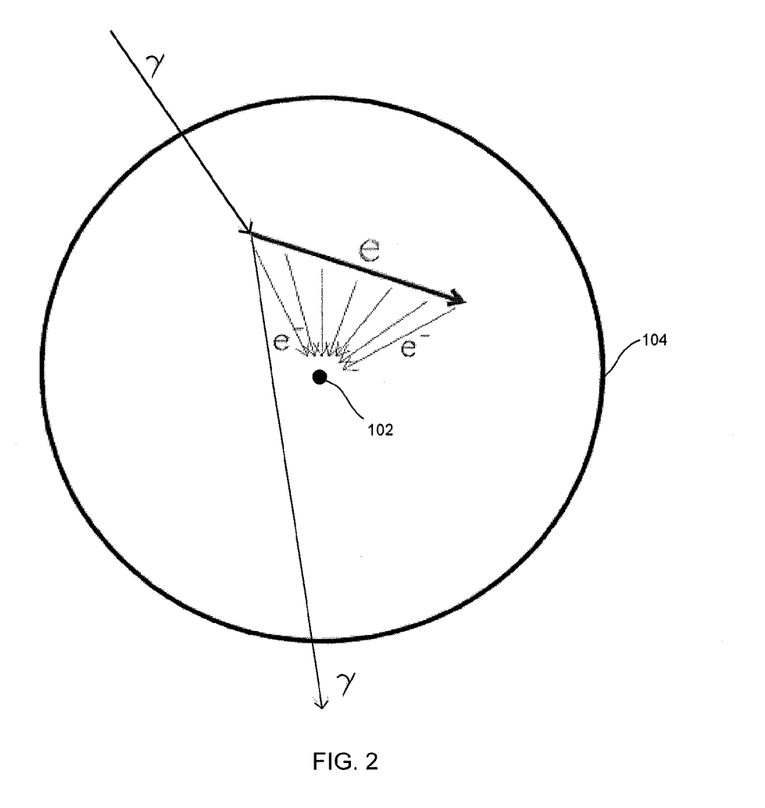
FIG. 2 shows a schematic view of a proportional counter in accordance with one or more embodiments of the present disclosure.

During operation of the proportional counter 100, a gamma-ray ($\gamma$) in FIG. 2, may pass through the gas-filled chamber of the cathode 104, in which the gamma-ray may interact with a gas atom along the path of the gamma-ray, thereby ionizing the gas atom to remove an electron (e) from the gas atom and create a positive ion from the gas atom. The electron may continue to travel through the gas of the proportional counter 100, thereby interacting with and ionizing other gas atoms to remove and create additional electrons (e) and positive ions from the gas atoms while moving throughout the proportional counter 100. For example, a 100 keV electron removed by a gamma-ray may create about 3,000 electron-ion pairs, which is known as primary ionization. As such, the positive charge of the anode 102 may be used to attract the electrons thereto, whereas the cathode then attracts the positive ions.

In the immediate vicinity of the anode 102, the field strength is strong enough such that the electron acquires additional energy to have the electron interact with additional gas atoms, thereby ionizing the gas atoms to free additional electrons and create additional positive ions from the gas atoms. A single free electron may be used in this vicinity to free a second electron, in which the two electrons may then interact with other gas atoms to free additional electrons, which is known as secondary ionization. From secondary ionization, the overall number of electrons may multiply in an avalanche-like process, known as a Townsend avalanche, such that the total number of electrons reaching the anode 102 is 1,000-10,000 times more than the number of electrons from primary ionization, often referred to as gas amplification. An electrical charge may then be collected at the anode 102 of the proportional counter 100 and discharged through the resistor 106 to create a detectable pulse. The conversion factor between the input energy of the initial charged particle and the output pulse height of the detectable pulse may be defined as the gain of the proportional counter 100.

A system and circuitry may be used to monitor gain of a proportional counter, particularly as the gain of a proportional counter may vary, fluctuate, and change due to one or more factors. For example, as discussed above, the gain of a proportional counter may vary from being present and in use within an industrial environment for a long period of time, and/or from operating within a broad range of temperatures. Further, a saturation effect may affect the reliability of the proportional counter, in which an ion cloud may form near the anode during high counting rates to weaken the electrostatic field around the anode. This weakening of the electrostatic field may also reduce the gain of the proportional counter.

In one or more embodiments, a gain monitoring process monitors and stabilizes the gain against a known reference, such as a source of gamma-ray emission or ionizing radiation of known energy. Examples of reference sources that may be used include cesium sources (Cs), potassium sources (K), americium-beryllium sources (AmBe), and cosmic rays. Further, the gas filling a proportional counter, which may include an inert gas, such as argon, helium, or xenon, usually may not be able to absorb more than 300-400 keV. As such, when a particle, such as a charged particle or a gamma-ray, is used in ionization, the particle may have enough energy to expel tightly held electrons from an inner orbital of a gas atom, such as the K-shell orbital of an atom. This removal of the electron renders the gas atom unstable, and electrons from higher orbitals move into the lower orbital to fill the hole left behind by the removed electron. The moving electron then releases energy in the form of a photon, the energy of which is equal to the energy difference between the two orbitals, such as a characteristic X-ray with a known energy, such as a K-line emission. Thus, energy and radiation is emitted having energy characterized by the gas present within the proportional counter, an emission referred to as X-ray fluorescence.

Figure 3:
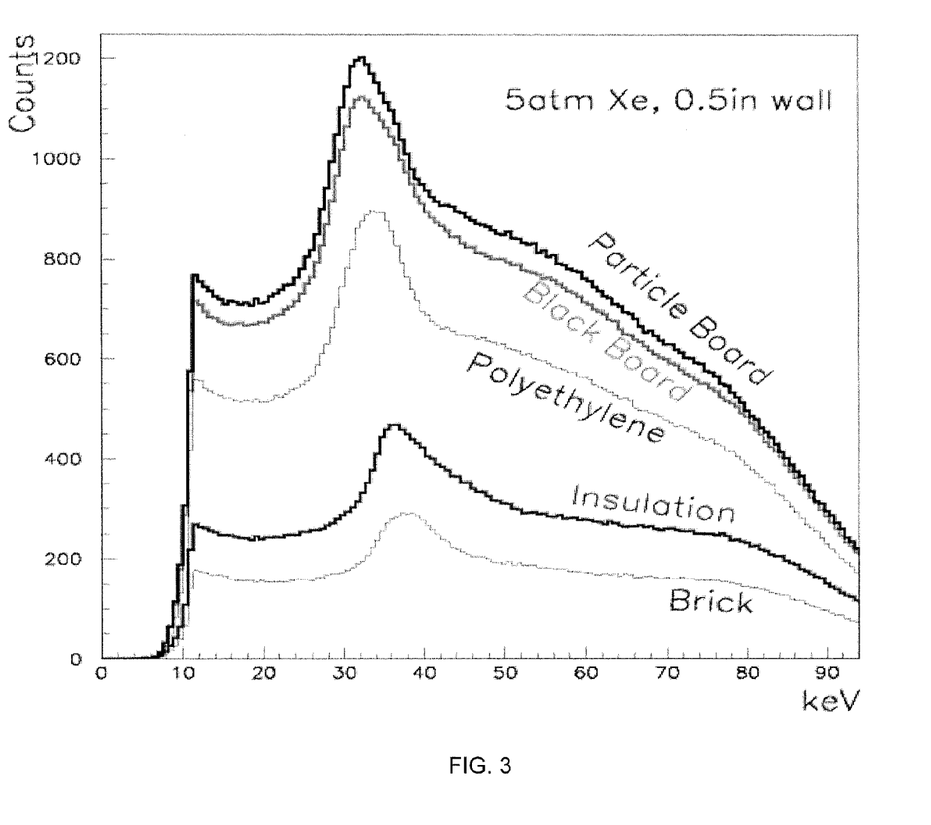
FIG. 3 shows a pulse height spectrum of $^{137}$Cs scattered back from different materials using a proportional counter in accordance with one or more embodiments of the present disclosure.

In accordance with one or more embodiments of the present disclosure, xenon may be used because of the strong interaction of gamma-rays with the gas. Further, in one or more embodiments, $^{137}$Cs may be used as a known reference radiation. Furthermore, X-ray fluorescence may have an energy peak present at about 34.5 keV, such as regardless of the source of the gamma radiation being used, as this energy peak is well within the detection threshold for a proportional counter. Accordingly, with reference to FIG. 3, a pulse height spectrum is shown of $^{137}$Cs scattered back from different materials using a proportional counter in accordance with one or more embodiments of the present disclosure. The x-axis of FIG. 3 represents the energy of the gamma-radiation scattered back from the different materials, and the y-axis represents the number of counts of gamma-radiation at a particular energy level. As shown, the detected gamma-radiation exhibits a clear peak at about the same energy due to the xenon K-line emission (around 34.5 keV). A slight change or shift in the peak position with respect to the counts and different materials reflects the reduction in gas amplification cause by an ion cloud forming near the anode of the proportional counter, as discussed above. One or more embodiments of the present disclosure may be used to compensate for this shift by monitoring and controlling the gain within a proportional counter.

The change and shifting in gain of a proportional counter may be adjusted and stabilized, such as by adjusting the voltage applied to the anode of the proportional counter, and/or adjusting the detection threshold of the proportional counter. Adjusting the voltage applied to the anode may move the position of the reference peak of the detected energy within the pulse height spectrum, but may also modify the shape of the pulse height spectrum. Accordingly, in accordance with one or more embodiments of the present disclosure, a detection threshold may be adjusted when monitoring the gain of a proportional counter.

Figure 4:
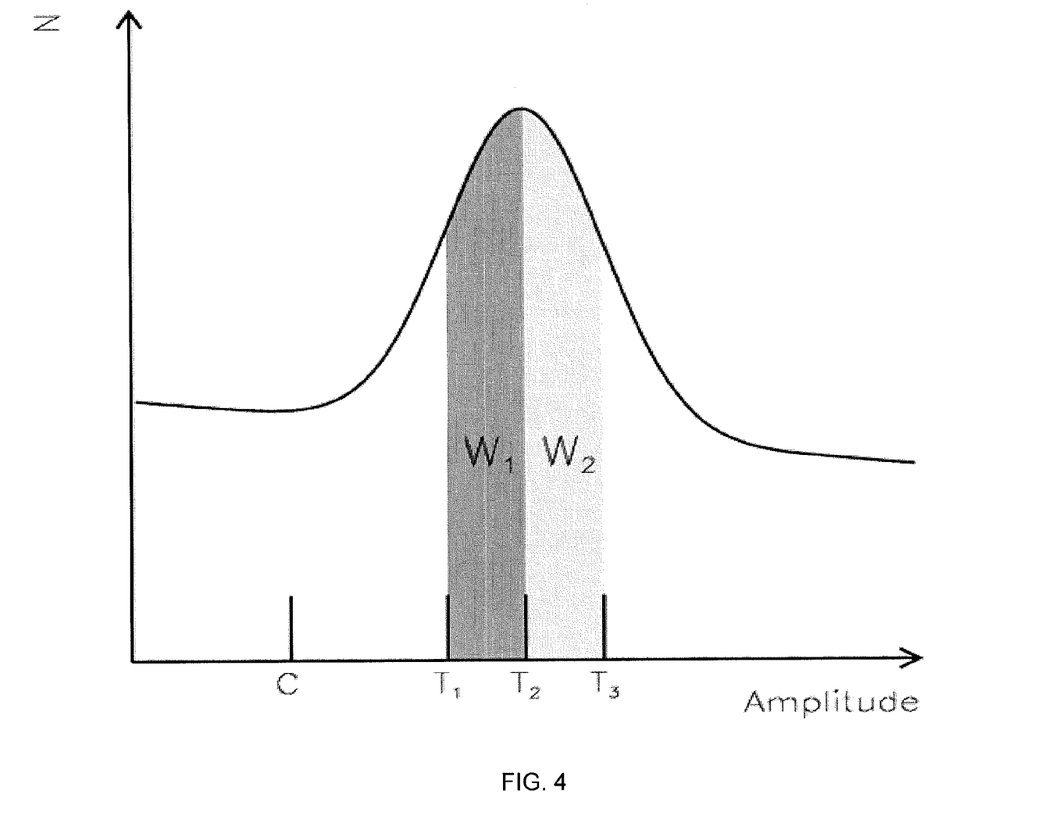
FIG. 4 shows a reference pulse height spectrum using a proportional counter in accordance with one or more embodiments of the present disclosure.

Referring now to FIG. 4, a reference pulse height spectrum using a proportional counter in accordance with one or more embodiments of the present disclosure is shown. The x-axis of FIG. 4 represents energy of charged particles detected using the proportional counter, and the y-axis represents the number of counts of the charged particles at a particular energy level. A first window $W_1$ and a second window $W_2$ may be defined within FIG. 4, and a counting threshold C for the proportional counter may also be defined within FIG. 4. As shown in FIG. 4, when monitoring the gain of a proportional counter, the gain monitor is implemented to maintain an equal number of counts between the first window $W_1$ and the second window $W_2$. The first window $W_1$ may be defined between a first threshold $T_1$ and a second threshold $T_2$, and the second window $W_2$ may be defined between the second threshold $T_2$ and a third threshold $T_3$. Those having ordinary skill in the art will appreciate, however, that other thresholds and/or ranges may be defined for the windows of the gain monitor without departing from the scope of the present disclosure, such as by using different thresholds altogether between the windows of the gain monitor. As such, in FIG. 4, the first threshold $T_1$, the second threshold $T_2$, and the third threshold $T_3$ may all be greater than the counting threshold C, with the second threshold $T_2$ larger than the first threshold $T_1$, and the third threshold $T_3$ larger than the second threshold $T_2$.

If, for any reason, the sensitivity changes for the proportional counter, the amplitude of the electrical pulses output from the proportional counter also changes. For example, if the gain of the proportional counter increases, the amplitude of the electrical pulses also increases. Referring to FIG. 4 then by way of example, this means that the peak of the height spectrum will shift to the right, toward the higher amplitudes. Consequently, the number of pulses with amplitudes in the first window $W_1$, referred to as a first window count, and the number of pulses with amplitudes in the second window $W_2$, referred to as a second window count, will change. Specifically, the number of pulses in the first window $W_1$ will decrease, and the number of pulses in the second window $W_2$ will increase. In one or more embodiments, to return the gain to normal, the gain monitor and control process may increase the thresholds defining the first window $W_1$ and the second window $W_2$ until the number of pulses in the first window $W_1$ becomes substantially equal to the number of pulses in the second window $W_2$. For example, the first threshold $T_1$, the second threshold $T_2$, and the third threshold $T_3$ may all be increased in proportion to the difference between the number of counts within the first window $W_1$ and the number of counts within the second window $W_2$. Further, the counting threshold C may be increased in proportion to the difference between the number of counts within the first window $W_1$ and the number of counts within the second window $W_2$. This may bring the gain back to its "normal" value, or equilibrium point.

On the other hand, if the gain of the proportional counter decreases, the amplitude of the electrical pulses also decreases. Referring to FIG. 4 then by way of example, this means that the peak of the height spectrum will shift to the left, toward the lower amplitudes. Consequently, the number of pulses with amplitudes in the first window $W_1$ and the second window $W_2$ will change. Specifically, the number of pulses in the first window $W_1$ will increase, and the number of pulses in the second window $W_2$ will decrease. In one or more embodiments, to return the gain to normal, the gain monitor and control process may decrease the thresholds defining the first window $W_1$ and the second window $W_2$ until the number of pulses in the first window $W_1$ becomes substantially equal to the number of pulses in the second window $W_2$. For example, the first threshold $T_1$, the second threshold $T_2$, and the third threshold $T_3$ may all be decreased in proportion to the difference between the number of counts within the first window $W_1$ and the number of counts within the second window $W_2$. Further, the counting threshold C may be decreased in proportion to the difference between the number of counts within the first window $W_1$ and the number of counts within the second window $W_2$. This may bring the gain back to its "normal" value, or equilibrium point.

As described above, having a first window count that is smaller than a second window count indicates that the gain has increased, and having a first window count that is larger than a second window count indicates that the gain has decreased. Hence, in one or more embodiments, the gain monitor and control process detects the difference between the first window count and the second window count, and in response, generates a control signal to change the thresholds defining the first window $W_1$ and the second window $W_2$ in proportion to this difference. Further, in one or more embodiments, the gain monitor and control process detects the difference between the first window count and the second window count, and in response, generates a control signal to change the counting threshold C in proportion to this difference.

Figure 5:
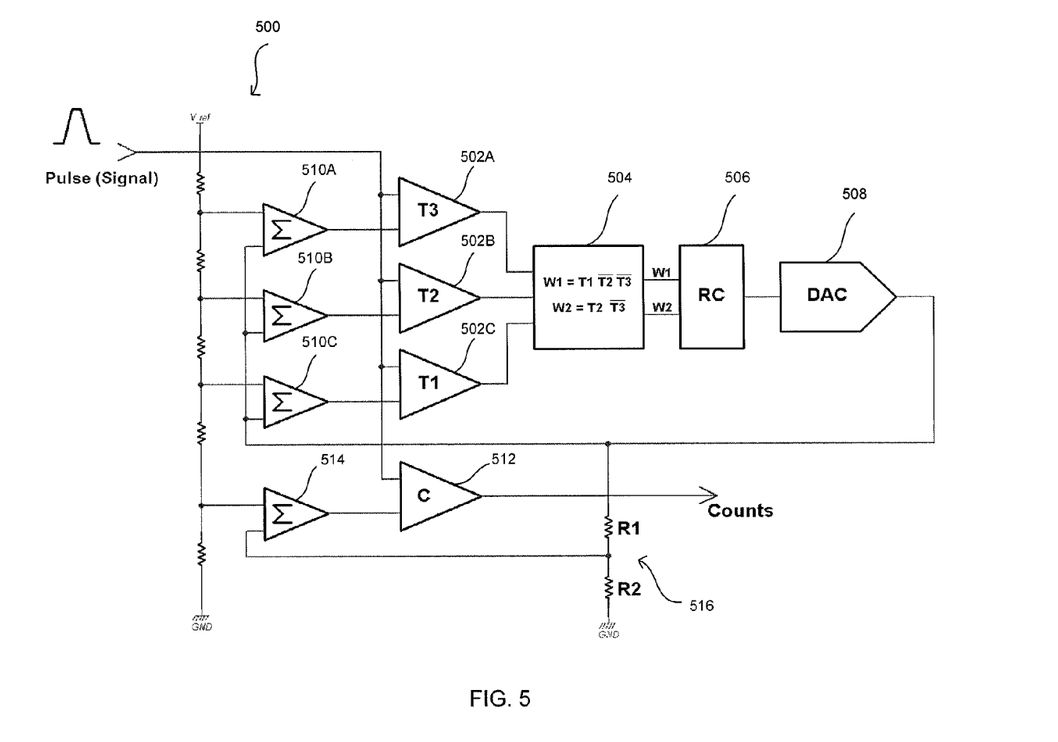
FIG. 5 shows a schematic view of a circuit to monitor gain of a proportional counter in accordance with one or more embodiments of the present disclosure.

Referring now to FIG. 5, a schematic view of a circuit 500 to monitor gain of a proportional counter in accordance with one or more embodiments of the present disclosure is shown. The circuit 500 may be connected to a proportional counter to receive the electrical pulses from the proportional counter, in which the circuit 500 may then output counts based upon the configuration of the circuit 500. As shown, the circuit 500 may include a plurality of discriminator units, such as a first discriminator unit 502A, a second discriminator unit 502B, and a third discriminator unit 502C. The discriminator units 502A, 502B, and 502C may each be connected to a logic gate unit 504, in which the discriminator units 502A, 502B, and 502C may correspond to the first threshold $T_1$, the second threshold $T_2$, and the third threshold $T_3$. For example, if an electrical pulse received by the circuit 500 is within the first window $W_1$, the first discriminator unit 502A and the second discriminator unit 502B may filter the pulse received, as the electrical pulse is not greater than the third threshold $T_3$ and the second threshold $T_2$ defining the first discriminator unit 502A and the second discriminator unit 502B, respectively. As such, the first discriminator unit 502A and the second discriminator unit 502B may not provide any corresponding pulse to the logic gate unit 504. However, as the electrical pulse is greater than the first threshold $T_1$, the third discriminator unit 502C may not filter or discriminate, thereby providing a corresponding pulse to the logic gate unit 504. By receiving this combination of pulses from the discriminator units 502A, 502B, and 502C, the logic gate unit 504 may determine that the electrical pulse received by the circuit 500 is within the first window $W_1$ If an electrical pulse received by the circuit 500 is within the second window $W_2$, the first discriminator unit 502A may filter the pulse received, as the electrical pulse is not greater than the third threshold $T_3$ defining the first discriminator unit 502A. As such, the first discriminator unit 502A may not provide any corresponding pulse to the logic gate unit 504. However, as the electrical pulse is greater than the second threshold $T_2$, the second discriminator unit 502B may not filter or discriminate, thereby providing a corresponding pulse to the logic gate unit 504. By receiving this combination of pulses from the discriminator units 502A and 502B, the logic gate unit 504 may determine that the electrical pulse received by the circuit 500 is within the second window $W_2$.

The logic gate unit 504 may then be connected to a counting unit 506, such as a reversible counter. In accordance with one or more embodiments, the counting unit 506 may be able to keep count of the electrical pulses received within the first window $W_1$ with respect to the second window $W_2$. For example, an electrical pulse received within the first window $W_1$ may decrement the state of the counting unit 506, and an electrical pulse received within the second window $W_2$ may increment the state of the counting unit 506. This decrementing and incrementing may allow the counting unit 506 to determine a difference between the counts and number of electrical pulses received within the first window $W_1$ and received within the second window $W_2$. The counting unit 506 may then be connected to a converter 508, such as a digit-to-amplitude converter, in which this difference and state of the counting unit 506 is converted into a voltage and output. The counting unit 506 may be used as a digital integrator in that the output from the convertor 508 is proportional to the difference between the number of pulses accumulated within the first window $W_1$ and the number of pulses accumulated within the second window $W_2$.

Further, the circuit 500 may include a plurality of summing units, such as a first summing unit 510A, a second summing unit 510B, and a third summing unit 510C. The summing units 510A, 510B, and 510C may be connected between the convertor 508 and the discriminator units 502A, 502B, and 502C, respectively. As such, the voltage that is output from the convertor 508 may be received by the summing units 510A, 510B, and 510C, in which the summing units 510A, 510B, and 510C may then correct or adjust (e.g., increase and/or decrease) the thresholds $T_1$, $T_2$, and $T_3$ of the discriminator units 502A, 502B, and 502C based upon the voltage output from the convertor 508. Thus, the difference between the number of pulses accumulated within the first window $W_1$ (the first window count) and the number of pulses accumulated within the second window $W_2$ (the second window count) is used to correct or adjust the thresholds $T_1$, $T_2$, and $T_3$ of the discriminator units 502A, 502B, and 502C in proportion to the determined difference.

For example, as discussed above, if more electrical pulses and counts are received within the second window $W_2$ than the first window $W_1$, indicating that the gain has increased, a gain monitor and control process may increase the thresholds $T_1$, $T_2$, and $T_3$ defining the first window $W_1$ and the second window $W_2$ until the number of pulses in the first window $W_1$ becomes substantially equal to the number of pulses in the second window $W_2$. However, if more electrical pulses and counts are received within the first window $W_1$ than the second window $W_2$, indicating that the gain has decreased, a gain monitor and control process may decrease the thresholds defining the first window $W_1$ and the second window $W_2$ until the number of pulses in the first window $W_1$ becomes substantially equal to the number of pulses in the second window $W_2$.

As discussed above, a gain monitor and control process, such as the circuit 500 in FIG. 5, may reach a state of equilibrium when the first window count is equal to the second window count. However, to account for any overcompensation from this monitor and control process, the counting threshold C, as shown in FIG. 4, may also be corrected or adjusted based upon the difference between the number of pulses accumulated within the first window $W_1$ (the first window count) and the number of pulses accumulated within the second window $W_2$ (the second window count). For example, with respect to FIG. 5, a discriminator unit 512 may be included within the circuit 500, in which the discriminator unit 512 may correspond to the counting threshold C. As such, for an electrical pulse received by the circuit 500 greater than the counting threshold C, the discriminator unit 512 may not filter or discriminate, thereby enabling the electrical pulse to be counted by the proportional counter.

Further, a summing unit 514 may be connected between the convertor 508 and the discriminator unit 512. As such, the voltage that is output from the convertor 508 may be received by the summing unit 514, in which the summing unit 514 may then correct or adjust (e.g., increase and/or decrease) the counting threshold C of the discriminator unit 512 based upon the voltage output from the convertor 508. Thus, the difference between the number of pulses accumulated within the first window $W_1$ (the first window count) and the number of pulses accumulated within the second window $W_2$ (the second window count) is used to adjust the counting threshold C of the discriminator unit 512 in proportion to the determined difference.

In accordance with one or more embodiments of the present disclosure, the correction or adjustment of the counting threshold may be a fraction of the correction or adjustment of the thresholds defining the first window and the second window. For example, with reference to FIGS. 4 and 5, though the counting threshold C, along with the thresholds $T_1$, $T_2$, and $T_3$, may be increased and decreased in proportion to the difference between the first window counts and the second window counts, the thresholds $T_1$, $T_2$, and $T_3$, may overall be increased or decreased more than the overall increase or decrease to the counting threshold C. Such a configuration may enable the gain monitor to not overcompensate when monitoring and controlling the gain of a proportional counter. As such, with reference to FIG. 5, the circuit 500 may include a voltage divider 516, such as by having the voltage divider 516, defined by a first resistor R1 and a second resistor R2, connected between the convertor 508 and the summing unit 514. This voltage divider 516 may be used to reduce the voltage received by the summing unit 516 from the convertor 508 such that only a fraction of the output from the convertor 508 is affecting the counting threshold C.

Figure 6:
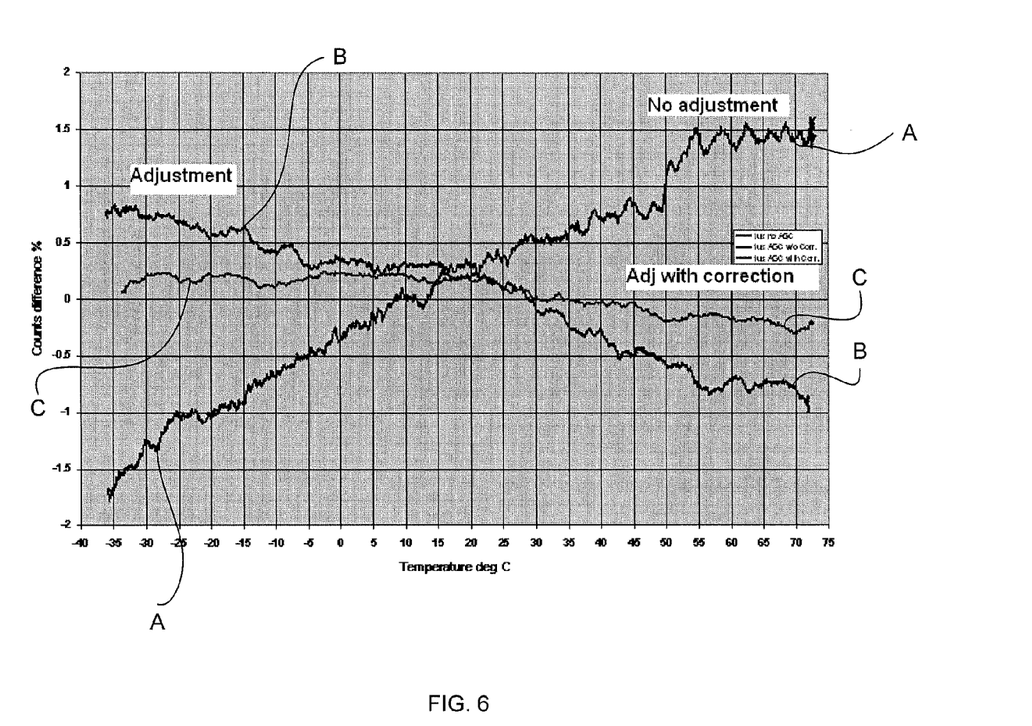
FIG. 6 shows a graph of results of a counting rate of a proportional counter from a radiation source monitored in an environmental chamber in accordance with one or more embodiments of the present disclosure.

For experimentation purposes, the counting rate of a proportional counter from a radiation source (in this case $^{137}Cs$)

was monitored in an environmental chamber. The results are illustrated graphically in FIG. 6. The x-axis of FIG. 6 represents the temperature when using the proportional counter, and the y-axis represents normalized counting rates of the proportional counter. The temperature in the environmental chamber was varied to monitor the change in proportional counter gain.

As expected, changing the temperature affected both the gain for the proportional counter. For example, spectrum A shows how temperature affects the normalized counting rate of a proportional counter having no monitor gain or correction, with the spectrum A moving between about −1.5% to about +1.5% across the measured temperatures. Spectrum B then shows how a gain monitor and control process in accordance with the present disclosure may improve the reliability of the gain of the proportional counter. A proportional counter corresponding to spectrum B would have each of the thresholds, including the counting threshold, adjusted with the same overall correction factor or voltage. As such, spectrum B is shown moving between less than about +1.0% to about −1.0% across the measured temperatures. Spectrum C then shows how a gain monitor and control process in accordance with the present disclosure may even further improve the reliability of the gain of the proportional counter. A proportional counter corresponding to spectrum C may have the correction or adjustment of the counting threshold be a fraction of the correction or adjustment of the thresholds defining the first window and the second window. As such, spectrum C is shown moving between less than about +0.25% to less than about −0.25% across the measured temperatures.

Figure 7:
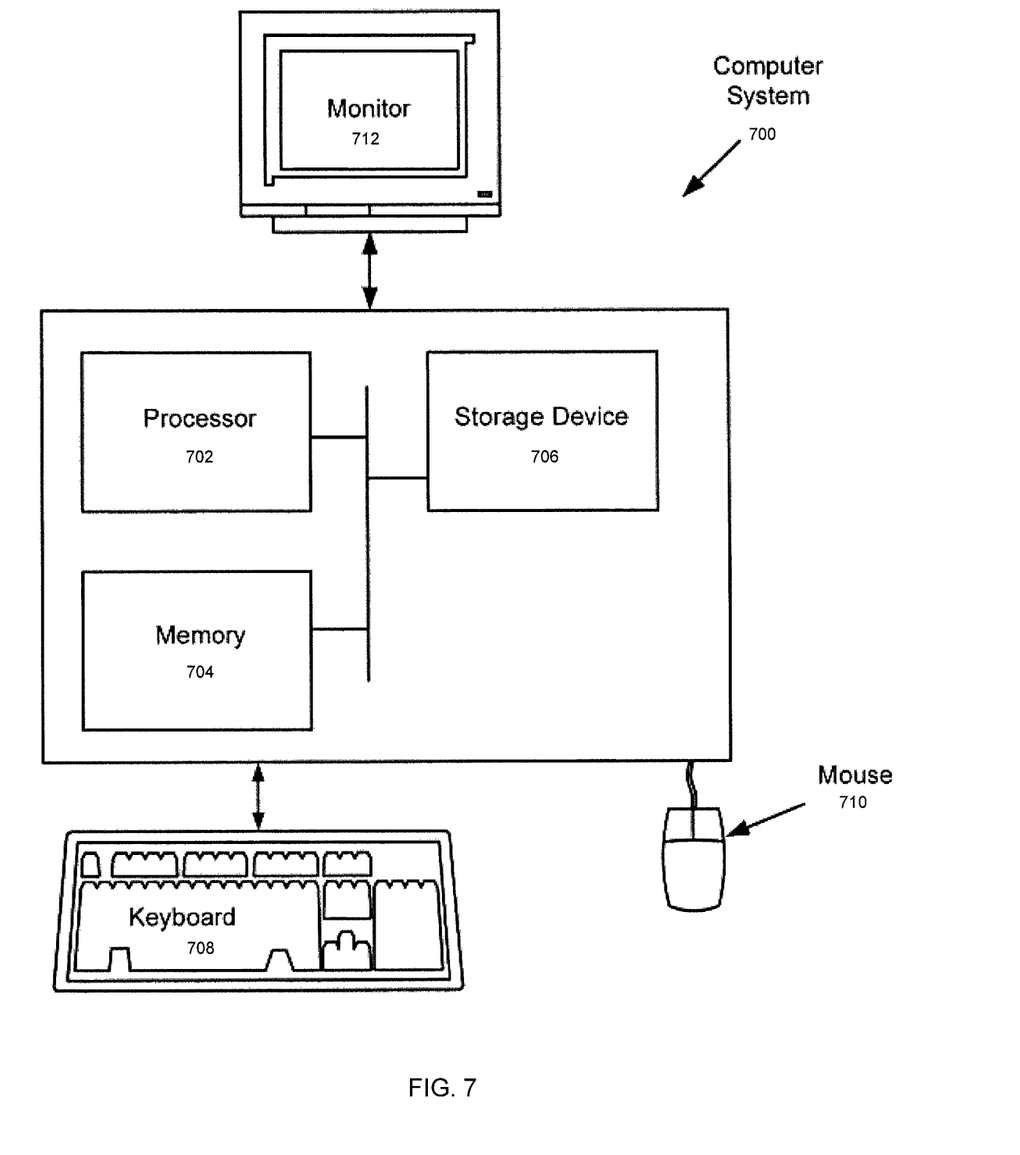
FIG. 7 shows a gain monitor system in accordance with one or more embodiments of the present disclosure.

Further, one or more embodiments of the gain monitor and control process may be implemented on any type of computer system as a proportional counter gain monitor system. For example, as shown in FIG. 7, a gain monitor system 700 includes a processor 702, associated memory 704, a storage device 706, and numerous other elements and functionalities typical of today's computers (not shown). The memory 704 may include instructions for causing the gain monitor system 700 to perform a gain monitor process in accordance with one or more embodiments of the present disclosure.

The gain monitor system 700 may also include input means, such as a keyboard 708 and a mouse 710, and output means, such as a monitor 712. The gain monitor system 700 may be connected to a local area network (LAN) or a wide area network (e.g., the Internet) (not shown) via a network interface connection (not shown). Those skilled in the art will appreciate that these input and output means may take other forms, now known or later developed.

Further, those skilled in the art will appreciate that one or more elements of the gain monitor system 700 may be located at a remote location and connected to the other elements over a network. Further, one or more embodiments may be implemented on a distributed system having a plurality of nodes, where each portion of the invention (e.g., intrusion detection system, response rewriter, server, client) may be located on a different node within the distributed system. In one or more embodiments, the node corresponds to a computer system. Alternatively, the node may correspond to a processor with associated physical memory. The node may alternatively correspond to a processor with shared memory and/or resources. Further, software instructions to perform embodiments of the invention may be stored on a tangible computer readable medium such as a digital video disc (DVD), compact disc (CD), a diskette, a tape, or any other suitable tangible computer-readable storage device.

Advantages of embodiments of the present disclosure may include one or more of the following. One or more embodiments of the present disclosure can effectively monitor and/or control the sensitivity (or gain) of a proportional counter such that the sensitivity remains relatively constant notwithstanding the presence of external or environmental factors, such as temperature, aging rate of the proportional counter, or other factors discussed above. Effectively maintaining the sensitivity of the detector enables the proportional counter to obtain measurements with better accuracy. Further, those skilled in the art will appreciate that embodiments of the present disclosure can be implemented in various environments or applications. For example, one or more embodiments of the present disclosure may be used to obtain accurate measurements from a proportional counter configured to measure physical parameters (such as density) of crude oil or refinery liquid.

Although the disclosure has been described with respect to only a limited number of embodiments, those skilled in the art, having benefit of this disclosure, will appreciate that other embodiments can be devised which do not depart from the scope of the present disclosure. Accordingly, the scope of the present disclosure should be limited only by the attached claims.

What is claimed is:

1. A method for monitoring gain of a proportional counter, the method comprising:
   generating a pulse height spectrum of the proportional counter;
   defining a first window and a second window within the pulse height spectrum;
   counting electrical pulses outputted by the proportional counter within the first window of the pulse height spectrum, thereby defining a first window count;
   counting electrical pulses outputted by the proportional counter within the second window of the pulse height spectrum, thereby defining a second window count;
   counting electrical pulses outputted by the proportional counter above a predetermined counting threshold of the pulse height spectrum;
   determining a difference between the first window count and the second window count; and
   correcting the counting threshold of the pulse height spectrum based upon the determined difference.

2. The method of claim 1, further comprising:
   correcting thresholds defining the first window and the second window of the pulse height spectrum based upon the determined difference.

3. The method of claim 2, wherein, if the first window count is more than the second window count, the correcting the thresholds defining the first window and the second window of the pulse height spectrum comprises:
   decreasing the thresholds defining the first window and the second window of the pulse height spectrum in proportion to the determined difference.

4. The method of claim 2, wherein, if the first window count is less than the second window count, the correcting the thresholds defining the first window and the second window of the pulse height spectrum comprises:
   increasing the thresholds defining the first window and the second window of the pulse height spectrum in proportion to the determined difference.

5. The method of claim 2, wherein the first window of the pulse height spectrum is defined by a first threshold and a second threshold, with the second threshold larger than the first threshold, and the second window of the pulse height spectrum is defined by the second threshold and a third threshold, with the third threshold larger than the second threshold.

6. The method of claim 5, wherein, if the first window count is more than the second window count, the correcting the counting threshold comprises:
decreasing the counting threshold of the pulse height spectrum in proportion to the determined difference.

7. The method of claim 5, wherein, if the first window count is less than the second window count, the correcting the counting threshold comprises:
increasing the counting threshold of the pulse height spectrum in proportion to the calculated/monitored difference.

8. The method of claim 1, further comprising:
correcting thresholds defining the first window and the second window of the pulse height spectrum based upon the determined difference;
wherein the correction of the counting threshold of the pulse height spectrum is a fraction of the correction of the thresholds defining the first window and the second window of the pulse height spectrum.

9. The method of claim 8, wherein the thresholds defining the first window and the second window of the pulse height spectrum are larger than the counting threshold of the pulse height spectrum.

10. A gain monitoring system for monitoring gain of a proportional counter, the system comprising:
a memory;
a processor operatively connected to the memory; and
computer-readable instructions stored in the memory for causing the processor to monitor the gain of the proportional counter, the instructions comprising:
generating a pulse height spectrum of the proportional counter;
defining a first window and a second window within the pulse height spectrum;
counting electrical pulses outputted by the proportional counter within the first window of the pulse height spectrum, thereby defining a first window count;
counting electrical pulses outputted by the proportional counter within the second window of the pulse height spectrum, thereby defining a second window count; and
counting electrical pulses outputted by the proportional counter above a predetermined counting threshold of the pulse height spectrum;
determining a difference between the first window count and the second window count; and
correcting the counting threshold of the pulse height spectrum based upon the determined difference.

11. The system of claim 10, the instructions further comprising:
correcting thresholds defining the first window and the second window of the pulse height spectrum based upon the determined difference.

12. The system of claim 11, wherein, if the first window count is more than the second window count, the correcting the thresholds defining the first window and the second window of the pulse height spectrum comprises:
decreasing the thresholds defining the first window and the second window of the pulse height spectrum in proportion to the determined difference.

13. The system of claim 11, wherein, if the first window count is less than the second window count, the correcting the thresholds defining the first window and the second window of the pulse height spectrum comprises:
increasing the thresholds defining the first window and the second window of the pulse height spectrum in proportion to the determined difference.

14. The system of claim 10, wherein, if the first window count is more than the second window count, the correcting the counting threshold comprises decreasing the counting threshold of the pulse height spectrum in proportion to the determined difference, and wherein, if the first window count is less than the second window count, the correcting the counting threshold comprises increasing the counting threshold of the pulse height spectrum in proportion to the calculated/monitored difference.

15. The system of claim 10, the instructions further comprising:
correcting thresholds defining the first window and the second window of the pulse height spectrum based upon the determined difference;
wherein the correction of the counting threshold of the pulse height spectrum is a fraction of the correction of the thresholds defining the first window and the second window of the pulse height spectrum.

16. The system of claim 15, wherein the thresholds defining the first window and the second window of the pulse height spectrum are larger than the counting threshold of the pulse height spectrum.

17. A method for monitoring gain of a proportional counter, the method comprising:
generating a pulse height spectrum of the proportional counter;
defining a first window and a second window within the pulse height spectrum;
counting electrical pulses outputted by the proportional counter within the first window of the pulse height spectrum, thereby defining a first window count;
counting electrical pulses outputted by the proportional counter within the second window of the pulse height spectrum, thereby defining a second window count;
counting electrical pulses outputted by the proportional counter above a predetermined counting threshold of the pulse height spectrum;
determining a difference between the first window count and the second window count;
correcting thresholds defining the first window and the second window of the pulse height spectrum based upon the determined difference; and
correcting the counting threshold of the pulse height spectrum based upon the determined difference;
wherein the correction of the counting threshold of the pulse height spectrum is a fraction of the correction of the thresholds defining the first window and the second window of the pulse height spectrum.

18. The method of claim 17, wherein the first window of the pulse height spectrum is defined by a first threshold and a second threshold, with the second threshold larger than the first threshold, wherein the second window of the pulse height spectrum is defined by the second threshold and a third threshold, with the third threshold larger than the second threshold, and wherein the first threshold is larger than the counting threshold.

* * * * *